United States Patent
Lamanna et al.

(10) Patent No.: US 10,979,060 B2
(45) Date of Patent: Apr. 13, 2021

(54) DIGITALLY CONTROLLABLE OSCILLATOR WITH HIGH ACCURACY

(71) Applicant: HUAWEI TECHNOLOGIES CO., LTD., Guangdong (CN)

(72) Inventors: Pasquale Lamanna, Munich (DE); Danilo Cardisciani, Munich (DE)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 16/389,746

(22) Filed: Apr. 19, 2019

(65) Prior Publication Data

US 2019/0312581 A1 Oct. 10, 2019

Related U.S. Application Data

(63) Continuation of application No. PCT/EP2016/075282, filed on Oct. 20, 2016.

(51) Int. Cl.
*H03L 7/099* (2006.01)
*H03L 7/18* (2006.01)
*H03B 5/12* (2006.01)

(52) U.S. Cl.
CPC .............. *H03L 7/0993* (2013.01); *H03B 5/12* (2013.01); *H03B 5/1212* (2013.01);
(Continued)

(58) Field of Classification Search
CPC ...... H03C 3/0958; H03B 5/12; H03B 5/1265; H03B 5/1212; H03L 7/0991;
(Continued)

(56) References Cited

U.S. PATENT DOCUMENTS 6,658,748 B1 12/2003 Leipold et al.
6,809,598 B1 10/2004 Staszewski et al.
(Continued)

FOREIGN PATENT DOCUMENTS

CN 1340809 A 3/2002
CN 1345482 A 4/2002
(Continued)

OTHER PUBLICATIONS

Robert B. Staszewski et al, SoC With an Integrated DSP and a 2.4-GHz RF Transmitter. IEEE Transactions on Very Large Scale Integration (VLSI) Systems, vol. 13, No. 11, Nov. 2005, 13 pages.
(Continued)

*Primary Examiner* — Arnold M Kinkead
(74) *Attorney, Agent, or Firm* — Womble Bond Dickinson (US) LLP (57) ABSTRACT

An oscillator is provided. The oscillator is configured for generating an output signal which is phase locked to an input signal. The oscillator comprises a controlled oscillator configured for generating the output signal based on an oscillator input signal. Moreover, the oscillator comprises a frequency divider configured for dividing the frequency of the output signal, resulting in a frequency divided feedback signal. Also, the oscillator comprises a phase detector, which is configured for generating an error signal based upon the frequency divided feedback signal and the input signal. Also, the oscillator comprises an error signal pulse train modulator configured for generating the oscillator input signal by performing a pulse train modulation of the error signal) or a signal derived from the error signal based on the input signal.

16 Claims, 8 Drawing Sheets

(52) U.S. Cl.
CPC ........... *H03B 5/1265* (2013.01); *H03L 7/099* (2013.01); *H03L 7/0991* (2013.01); *H03L 7/18* (2013.01); *H03L 2207/06* (2013.01); *H03L 2207/50* (2013.01)

(58) Field of Classification Search
CPC . H03L 2207/50; H03L 2207/06; H03L 7/099; H03L 7/18
USPC ................................. 331/1 A, 16, 17, 18, 34
See application file for complete search history.

(56) References Cited

U.S. PATENT DOCUMENTS

| | | | | |
|---|---|---|---|---|
| 7,692,500 | B1* | 4/2010 | Koukab | H03C 3/0958 |
| | | | | 331/1 A |
| 7,746,185 | B2 | 6/2010 | Staszewski et al. | |
| 7,772,900 | B2 | 8/2010 | Ainspan et al. | |
| 9,019,017 | B2* | 4/2015 | Chaivipas | H03L 7/093 |
| | | | | 331/1 A |
| 2008/0111641 | A1 | 5/2008 | Huang et al. | |
| 2008/0116982 | A1 | 5/2008 | van der Valk et al. | |
| 2008/0315928 | A1 | 12/2008 | Waheed et al. | |
| 2009/0096535 | A1 | 4/2009 | Chang | |
| 2009/0256639 | A1 | 10/2009 | Chiu et al. | |
| 2010/0013531 | A1 | 1/2010 | Ainspan et al. | |
| 2010/0013532 | A1 | 1/2010 | Ainspan et al. | |
| 2010/0188158 | A1 | 7/2010 | Ainspan et al. | |
| 2012/0013376 | A1 | 1/2012 | Thacker et al. | |
| 2012/0244824 | A1 | 9/2012 | Entezari et al. | |
| 2013/0093524 | A1 | 4/2013 | Nakamura | |
| 2014/0035691 | A1 | 2/2014 | Lamanna et al. | |
| 2014/0368242 | A1* | 12/2014 | Unruh | H03L 1/00 |
| | | | | 327/156 |

FOREIGN PATENT DOCUMENTS

| | | |
|---|---|---|
| CN | 101183869 A | 5/2008 |
| CN | 101414826 B | 7/2011 |
| CN | 102414980 A | 4/2012 |
| CN | 102739246 A | 10/2012 |
| CN | 203434964 U | 2/2014 |
| CN | 105959003 A | 9/2016 |
| JP | 2013089997 A | 5/2013 |
| WO | 2012020501 A1 | 2/2012 |

OTHER PUBLICATIONS

Min Park et al, A Time-Domain Resolution Improvement of an RF-DAC. IEEE Transactions on Circuits and Systems—II: Express Briefs, vol. 57, No. 7, Jul. 2010, 5 pages.

"Robert Bogdan Staszewski et al, A First Multigigahertz Digitally Controlled Oscillatorfor Wireless Applications. IEEE Transactions on Microwave Theory and Techniques, vol. 51, No. 11, Nov. 2003, 11 pages".

\* cited by examiner

DIGITALLY CONTROLLABLE OSCILLATOR WITH HIGH ACCURACY

CROSS-REFERENCE TO RELATED APPLICATIONS

This application is a continuation of International Application No. PCT/EP2016/075282, filed on Oct. 20, 2016, which is hereby incorporated by reference in its entirety.

TECHNICAL FIELD

The application relates to a digitally controllable oscillator, which can be tuned to a specific frequency with very small frequency steps and a high accuracy.

BACKGROUND

Digitally Controllable Oscillators (DCO) for frequency synthesizers require a fine frequency stepping at the DCO output. Oscillators include varactors (variable reactors), which can be implemented as voltage-dependent capacitors whose capacitance depends on a control voltage. The finest varactor step size feasible in advanced CMOS lithography is in the order of tens of attofarads. This value unfortunately is still too coarse for Radio Frequency (RF) standards.

In an exemplary solution, Sigma-Delta Modulation techniques and/or complex analog capacitive divider structures are used to improve the resolution, to reduce quantization noise and to enhance the time-averaged frequency resolution $\Delta f_{DCO}$ in DCOs.

Figure 1:
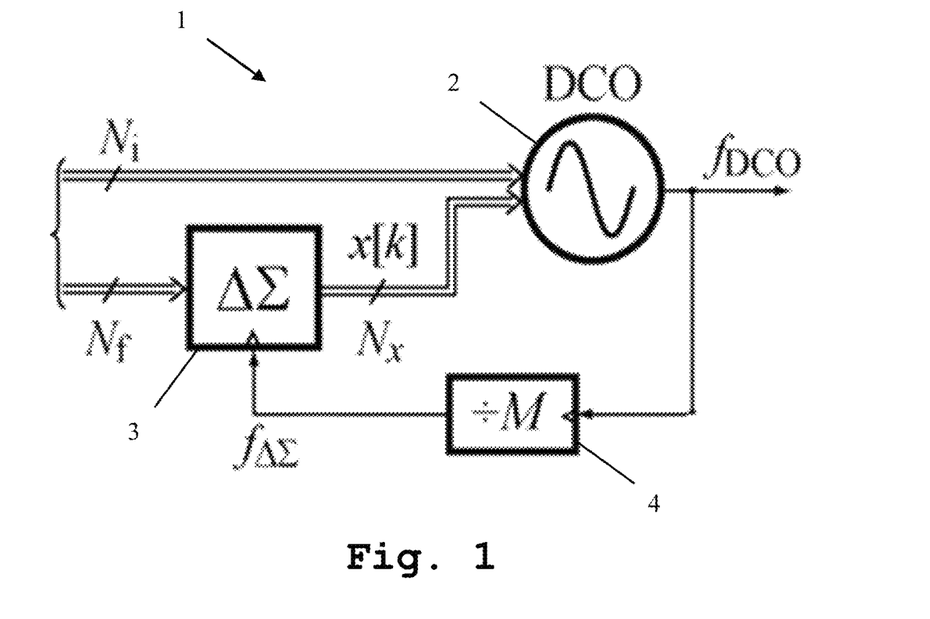
FIG. 1 shows an exemplary oscillator.

An exemplary oscillator 1 is shown in FIG. 1. The oscillator 1 comprises a controllable oscillator 2, which is connected to a frequency divider 4 and to a Sigma-Delta Modulator 3. The controllable oscillator 2 is provided with an input code $N_i$ and a difference signal $N_x$. The Sigma-Delta Modulator 3 is provided with an input frequency $N_f$ and a divided frequency signal $f_{\Delta\Sigma}$, which is generated by the frequency divider 4 based on an output signal $f_{DCO}$ provided by the controllable oscillator 2.

Figure 2:
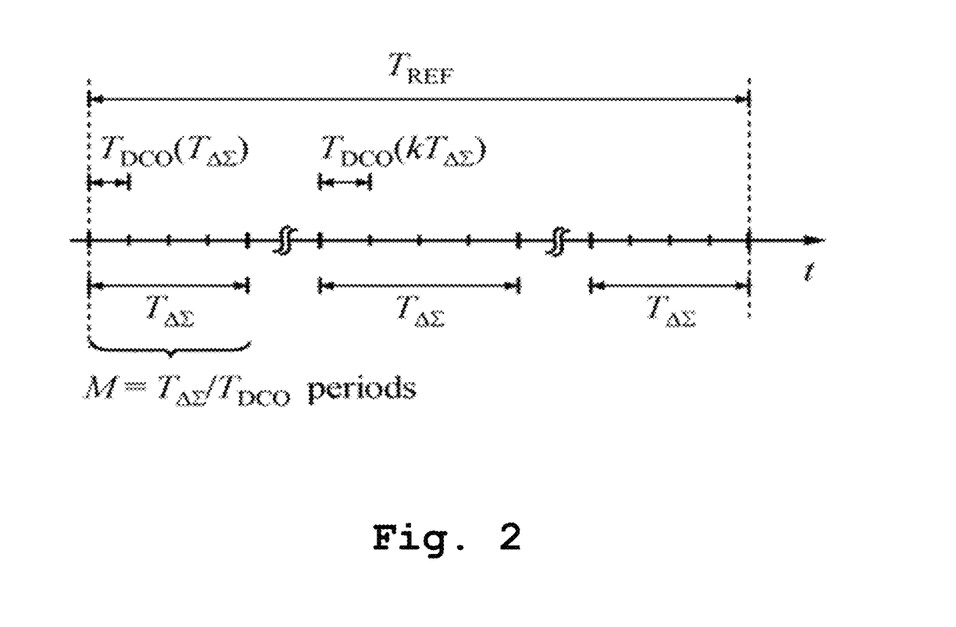
FIG. 2 shows the timing during a period of a reference signal of the exemplary oscillator of FIG. 1.

In FIG. 2, the timing of the modulation by the Sigma-Delta Modulator 1 is shown.

The frequency resolution may be enhanced through high-speed SD dithering. The input code $N_i$ is updated at the reference clock rate $f_{ref}$ and it is active during all of a period $T_{ref}$. The frequency resolution of the controllable oscillator 2 is $\Delta f_{DCO}$. This frequency step produces a quantization phase noise given by following equation:

$$L(\Delta f) = \frac{1}{12}\left(\frac{\Delta f_{DCO}}{\Delta f}\right)^2 \frac{1}{f_{REF}}\left(\sin c \frac{\Delta f}{f_{REF}}\right)^2$$

Where $\Delta f_{DCO}$ is the frequency resolution of DCO, $\Delta f$ is the offset frequency, and $f_{REF}$ is the DCO code updating frequency. Even with the finest varactor resolution, the resulting phase noise will normally be too high for wireless applications.

Using SD dithering would result in an increased resolution of $$L(\Delta f) = \frac{1}{12}\left(\frac{\Delta f_{frac}}{\Delta f}\right)^2 \frac{1}{f_{dither}}\left(\sin c \frac{\Delta f}{f_{dither}}\right)^2$$

Where $f_{dither}$ is the frequency of dithering and is given by $f_{dither}=1/T_{\Delta\Sigma}$. $f_{dither}$ is much higher than $f_{REF}=1/T_{REF}$, as can be seen from FIG. 2, and $$\Delta f_{frac} = \frac{\Delta f_{DCO}}{2^{N_f}}.$$

The $\Sigma\Delta$ varactor dithering moves the varactor quantization noise energy to high-frequency offsets at the RF output. Typical $\Sigma\Delta$ modulator realization balances the need for adequate dithering randomization while not violating the DCO phase noise spectrum. To achieve such results second or higher order multistage noise shaping (MASH) sigma-delta modulator (SDM) with multibit input code could produce a sufficiently fine resolution. However the implementation of such dithering schemes results in ill-behaved spurs in the DCO output spectrum. These spurs are further degraded by varactor and timing mismatches in the DCOs.

Alternatively, capacitive divider structures may be used. There, a plurality of capacitive devices are embedded in a complex capacitive structure in parallel with other equivalent structures in such a way that the equivalent capacitance is lower than the effective capacitance used. To implement a fine frequency step, a complex analog architecture needs to be used. By use of this structure, a finer frequency resolution is obtained by using a minimum size capacitor inside a capacitor divider structure in such way that the equivalent step of capacitance is lower than the value provided by the employed technology.

Due to the inherent difficulty of reproducing a complete matching between the fine and coarse structures, the full range of the fine structure should be designed larger than a single element of the coarse structure in such a way that the DCO has no missing frequency span at the output. To match the dynamic range of the fine structure with a single element of the coarse structure, complex calibration algorithms need to be employed. Horizontal slice quantization—the varactor code changes at each rising edge of the $f_{REF}$ signal and it is held constant for a $T_{REF}$ period of input—may be used. This topology requires, as previous stated, a complex calibration algorithm implemented in the digital section.

To have the complete coverage of fine range over coarse LSB, the dynamic range of the fine structure must be larger than LSB of the coarse structure. Then, an accurate calibration is mandatory to make a perfect and accurate frequency coverage fine vs. coarse. A problem of this structure is the high difficulty to accurately match the dynamic range of the fine capacitive bank structure with the LSB of coarse capacitive bank structure because they are analog quantities derived by different types of devices. In fact the matching of the structures makes it impossible to achieve the accuracy level required for a great deal of applications. For this reason in the fine structure, M levels are chosen in such a way that they fully cover the LSB of the coarse structure.

This topology requires a calibration of fine structure versus coarse structure LSB. The employed calibration algorithm though is quite complicated.

Therefore, the complexity of the particular topology required for implementing such a division effect and the use of different types of analog components makes the system sensitive to mismatch and requires a complex calibration algorithm implemented in the digital section to match the dynamic range of each structure with the others and to mitigate the impairments. Moreover an accurate matching between the levels of quantization and the capacitance step ΔC is very difficult to obtain in the analog domain, so the calibration is never optimizable over the full range of frequencies of DCO. The inherent mismatch moreover produces spurs in the resulting performance diagram.

SUMMARY

Accordingly, an object of the present application is to provide a digitally controllable oscillator with a very fine stepping, which is simple to produce and does not require a complex calibration.

The object is solved by the features of claim 1 for the apparatus. The dependent claims contain further developments.

According to a first aspect of the application, an oscillator is provided. The oscillator is configured for generating an output signal which is phase locked to an input signal. The oscillator comprises a controlled oscillator configured for generating the output signal based on an oscillator input signal. Moreover, the oscillator comprises a frequency divider configured for dividing the frequency of the output signal, resulting in a frequency divided feedback signal. Also, the oscillator comprises a phase detector, which is configured for generating an error signal based upon the frequency divided feedback signal and the input signal. Also, the oscillator comprises an error signal pulse train modulator configured for generating the oscillator input signal by performing a pulse train modulation of the error signal or a signal derived from the error signal based on the input signal. By performing the pulse train modulation, it is possible to achieve a very fine stepping of the oscillator at high accuracy.

According to a first embodiment of the first aspect, the oscillator further comprises a loop filter configured for performing a low-pass filtering of the error signal, resulting in a filtered error signal. The error signal pulse train modulator is configured for generating the oscillator input signal by performing a pulse train modulation of the filtered error signal. This further increases the accuracy of the oscillator.

According to a second embodiment of the first aspect or the first embodiment, the error signal pulse train modulator is configured for generating the oscillator input signal as a number x of pulses separated by a number of N−x of gaps within the period of the input signal. N is a number of slots for pulses and gaps in one period of the input signal. The error signal pulse train modulator is then configured for setting the number x of pulses proportional to the error signal or a signal derived from the error signal. It is thereby possible to very accurately control the oscillator output signal.

According to another embodiment, the error signal pulse train modulator is configured for equally spacing the pulses over the period of the input signal and equally spacing the gaps over the period of the input signal. A further increase in output signal accuracy can thereby be achieved.

According to another embodiment, the error signal pulse train modulator is configured for setting an equal first time duration for all pulses and setting an equal second time duration for all gaps. A very simple implementation of the error signal pulse train modulator is thereby achieved.

According to another embodiment, the error signal pulse train modulator comprises an input signal modulator configured for generating a number N of modulator output signals, such that a number x of the N modulator output signals is high, a number of N−x of the modulator output signals is low, and x/N is proportional to the error signal or the signal derived from the error signal. The error signal pulse train modulator is configured for generating the oscillator input signal from x/N. An especially simple implementation of the pulse train modulator is thereby achieved.

According to another embodiment, the error signal pulse train modulator comprises a flip-flop chain, wherein the flip-flop chain comprises a number of N flip-flops. The input signal is supplied to an enable input of a first flip-flop in the flip-flop chain. The N flip-flops of the flip-flop chain are arranged so that an inverted output of each flip-flop is connected to an enable input of the following flip-flop in the flip-flop chain. This assures an especially simple construction of the pulse train modulator.

According to another embodiment, the error signal pulse train modulator comprises a first flip-flop chain and a second flip-flop chain, wherein the first flip-flop chain and the second flip-flop chain each comprise N/2 flip-flops. The input signal is supplied to an enable input of the first flip-flop in the first flip-flop chain and to an enable input of a first flip-flop in the second flip-flop chain. The N/2 flip-flops of the first flip-flop chain are arranged so that an inverted output of each flip-flop is connected to an enable input of the following flip-flop in the first flip-flop chain. The N/2 flip-flops of the second flip-flop chain are arranged so that an inverted output of each flip-flop is connected to an enable input of the following flip-flop in the second flip-flop chain. The first flip-flop chain is active during high periods of the input signal and the second flip-flop chain is active during low periods of the input signal. This construction reduces the frequency requirements with regard to the individual flip-flops, since each flip-flop only has to operate on half frequency.

According to another embodiment, the error signal pulse train modulator comprises a weighting unit, configured for weighting the output of each flip-flop with one of the modulator output signals resulting in N weighted flip-flop output signals. This allows for a simple construction of the error signal pulse train modulator.

According to another embodiment, the weighting unit is configured for adding the weighted flip-flop output signals resulting in the oscillator input signal. Also this allows for a very simple construction of the error signal pulse train modulator.

According to another embodiment, clock inputs of the flip-flops are supplied with a clock signal derived from the output signal. This allows for an especially accurate synchronous operation.

According to another embodiment, the frequency divider comprises a first frequency divider configured for dividing the frequency of the output signal resulting in a first frequency divided signal. The frequency divider furthermore comprises a second frequency divider configured for dividing the frequency of the first frequency divided signal, resulting in the frequency divided feedback signal. The first frequency divided signal is the clock signal. This allows for a very simple generation of the clock signal.

According to another embodiment, the input signal, the output signal, the oscillator input signal, the frequency divided feedback signal, the error signal and the signal derived from the error signal are digital signals. The controllable oscillator is a digital controllable oscillator. This allows for a simple construction of the oscillator.

According to another embodiment, the frequency of the input signal is at least by a factor of 10, preferably 100, most preferably 1000, lower than the output signal. This allows for a very simple construction of the oscillator, since the frequency requirements regarding the components located before the oscillator are low.

According to a second aspect of the application, a method for generating an output signal which is phase locked to an input signal is provided. The method comprises generating, by a controlled oscillator, the output signal based on an oscillator input signal, dividing by a frequency divider, the frequency of the output signal, resulting in a frequency divided feedback signal, generating, by a phase detector, an error signal based upon the frequency divided feedback signal and the input signal, and generating by an error signal pulse train modulator, the oscillator input signal by performing a pulse train modulation of the error signal or a signal derived from the error signal based on the input signal. This allows for a very simple and accurate generation of the output signal.

According to a first embodiment of the second aspect, a low pass filtering of the error signal resulting in a filtered error signal, is performed. The oscillator input signal is generated by performing a pulse train modulation of the filtered error signal. This further increases the accuracy of the oscillator.

According to another embodiment of the second aspect, the oscillator input signal is generated as a number of x pulses separated by a number of N–x gaps within the period of the input signal. N is a number of slots for pulses and gaps in one period of the input signal. The number x of pulses is set proportional to the error signal or a signal derived from the error signal. It is thereby possible to very accurately control the oscillator output signal.

According to another embodiment, the pulses are evenly spaced over the period of the input signal and the gaps are evenly spaced over the period of the input signal. A further increase in output signal accuracy can thereby be achieved.

According to another embodiment, an identical first time duration is set for all pulses and an identical second time duration is set for all gaps. A very simple implementation of the error signal pulse train modulator is thereby achieved.

According to another embodiment, a number N of modulator output signals is generated such that a number x of the N modulator output signals is high, a number N–x of the modulator output signals is low and x/N is proportional to the error signal or the signal derived from the error signal. The oscillator input signal is derived from x/N. An especially simple implementation of the pulse train modulator is thereby achieved.

According to another embodiment, the input signal is supplied to an enable input of a first flip-flop in a flip-flop chain comprising N flip-flops and the N flip-flops of the flip-flop chain are arranged so that an inverted output of each flip-flop is connected to an enable input of the following flip-flop in the flip-flop chain. This assures an especially simple construction of the pulse train modulator.

According to another embodiment, the input signal is supplied to an enable input of a first flip-flop of a first flip-flop chain and to an enable input of a first flip-flop in a second flip-flop chain. Each of the flip-flop chains comprises N/2 flip-flops. The N/2 flip-flops in the first flip-flop chain and the second flip-flop chain are arranged so that an inverted output of each flip-flop is connected to an enable input of the following flip-flop in the respective flip-flop chain. The first flip-flop chain is active during high periods of the input signals and the second flip-flop chain is active during low periods of the input signal. This construction reduces the frequency requirements with regard to the individual flip-flops, since each flip-flop only has to operate on half frequency.

According to another embodiment, a weighting of the output of each flip-flop with a modulator output signal resulting in N weighted flip-flop output signals is performed. This allows for a simple construction of the error signal pulse train modulator.

According to another embodiment, the weighted flip-flop output signals are added up resulting in the oscillator input signal. Also this allows for a very simple construction of the error signal pulse train modulator.

According to another embodiment, the clock inputs of the flip-flops are supplied with a clock signal derived from the output signal. This allows for an especially accurate synchronous operation.

According to another embodiment, the frequency division is performed in two steps. In a first step, a frequency division resulting in a first frequency divided signal is performed. In a second step, a second frequency division of the first frequency divided signal resulting in the frequency divided feedback signal is performed. The first frequency divided signal in this case is the clock signal. This allows for a very simple generation of the clock signal.

According to another embodiment, the input signal, the output signal, the oscillator input signal, the frequency divided feedback signal, the error signal and the signal derived from the error signal are digital signals. The controllable oscillator is a digitally controllable oscillator. This allows for a simple construction of the oscillator.

According to another embodiment, the frequency of the input signal is at least by a factor 10, preferably 100, most preferably 1000 lower than the output signal. This allows for a very simple construction of the oscillator, since the frequency requirements regarding the components located before the oscillator are low.

Generally, it has to be noted that all arrangements, devices, elements, units and means and so forth described in the present application could be implemented by software or hardware elements or any kind of combination thereof. Furthermore, the devices may be processors or may comprise processors, wherein the functions of the elements, units and means described in the present applications may be implemented in one or more processors. All steps which are performed by the various entities described in the present application as well as the functionality described to be performed by the various entities are intended to mean that the respective entity is adapted to or configured to perform the respective steps and functionalities. Even if in the following description or specific embodiments, a specific functionality or step to be performed by a general entity is not reflected in the description of a specific detailed element of that entity which performs that specific step or functionality, it should be clear for a skilled person that these methods and functionalities can be implemented in respect of software or hardware elements, or any kind of combination thereof.

BRIEF DESCRIPTION OF THE DRAWINGS

The present application is in the following explained in detail in relation to embodiments of the application in reference to the enclosed drawings, in which.

DESCRIPTION OF THE EMBODIMENTS

Figure 3:
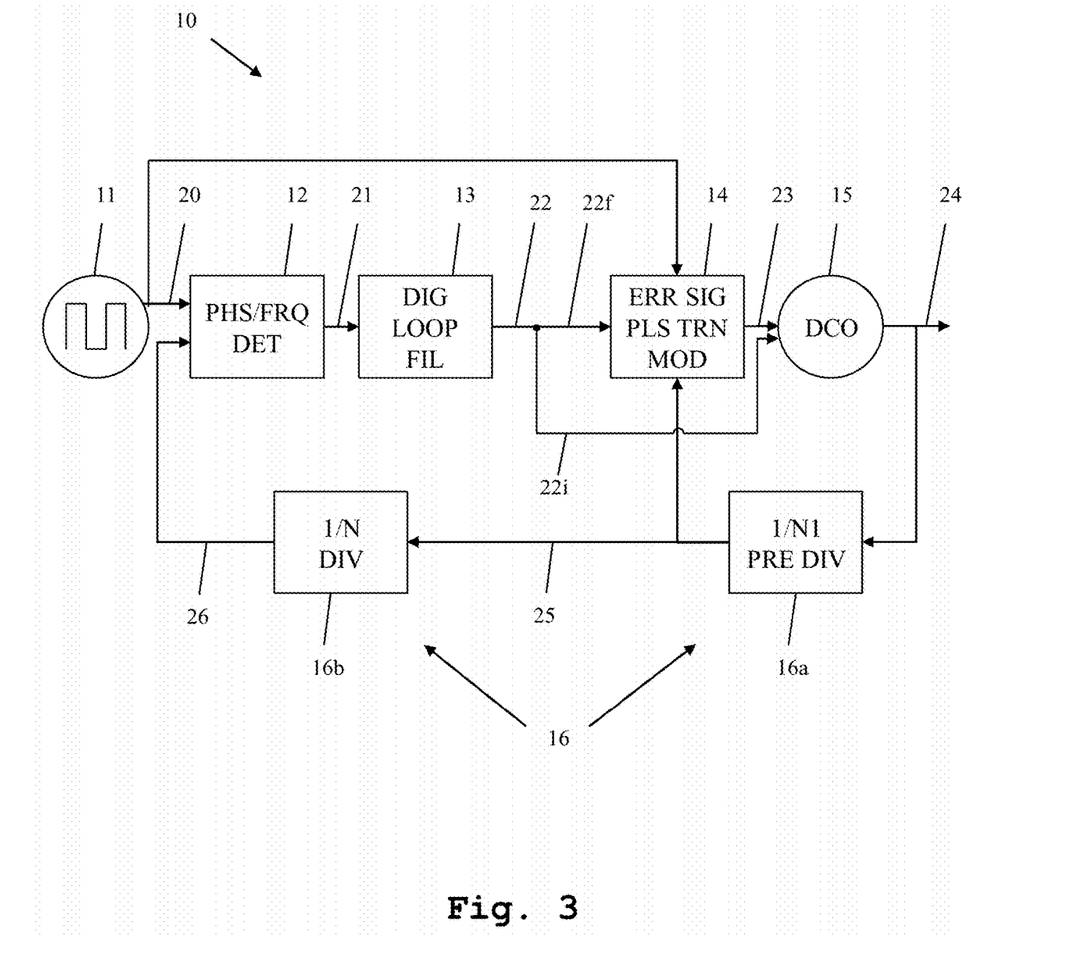
FIG. 3 shows a first embodiment of the oscillator according to the first aspect of the application.

First, the function of an exemplary oscillator has been described in FIG. 1 and FIG. 2. In the following, the general function of an embodiment of the first aspect of the application is shown in FIG. 3-FIG. 4b. In FIG. 5-FIG. 8, further details of different embodiments of the first aspect of the application are described. Finally in FIG. 9, the function of an embodiment of the second aspect of the application is described. Similar entities and reference numbers in different figures have been partially omitted.

In FIG. 3, a first embodiment of the digitally controllable oscillator 15 according to the first aspect of the application is shown inside an all-digital phase locked loop (ADPLL 10). The ADPLL 10 receives an input signal from an input signal source or input signal generator 11. The input signal is fed to a phase detector 12, which may be connected to a loop filter 13. The phase detector 12 is connected, optionally through the loop filter 13, to an error signal pulse train modulator 14, which is connected to a digitally controlled oscillator (DCO) 15. The controlled oscillator 15 moreover is connected to a frequency divider 16, which may be put into practice, such as in this case, as a first frequency divider 16a and a second frequency divider 16b. The output of the first frequency divider 16a is connected to the error signal pulse train modulator 14 and to an input of the second frequency divider 16b. An output of the second frequency divider 16b is connected to the phase detector 12. Moreover, the input signal generator 11 is connected to the error signal pulse train modulator 14.

The input signal generator 11 generates an input signal 20 and provides it to the phase detector 12 and to the error signal pulse train modulator 14. The phase detector 12 is moreover provided with a frequency divided feedback signal 26 from the second frequency divider 16. The phase detector 12 performs a phase detection and thereby generates an error signal 21 based upon the frequency divided feedback signal 26 and the input signal 20. The error signal 21 is provided to the loop filter 13, which performs a low pass filtering of the error signal 21 resulting in a digital control word 22. The digital control word 22 is composed of an integer part or integer digital control word (22i) and a fractional part or fractional digital control word (22f). The integer digital control word 22i is provided directly to the DCO input while the fractional digital control word 22f is provided to the error signal pulse train modulator 14. The error signal pulse train modulator 14 generates a digital pulse train 23 by performing a pulse train modulation of the fractional digital control word 22f based on the input signal 20 output by the input signal generator 11. Specifically, the duration of a time window of each modulation train is specified by the period of the input signal 20. The DCO 15 inputs are the integer digital control word 22i and the digital pulse train 23. Regarding the function of the error signal pulse train modulator 14, it is referred to the elaborations in FIG. 4a FIG. 8. The resulting digital pulse train 23 is provided to the controlled oscillator 15, which generates the output signal 24 based on the integer digital control word 22i and the digital pulse train 23. The output signal 24 is moreover provided to the frequency divider 16, which performs a frequency division resulting in the frequency divided feedback signal 26. In the embodiment shown here, the first frequency divider 16a generates a first frequency divided signal 25, which is also provided to the error signal pulse train modulator 14 and used as a clock signal there. The first frequency divided feedback signal 25 is also provided to the second frequency divider 16b, which performs a second frequency division resulting in the frequency divided feedback signal 26.

The use of the first frequency divider reduces the frequency of the output of the DCO down to a level that can be managed by the second frequency divider. A division factor N1 of the first frequency divider 16a is much smaller than a division factor N of the second frequency divider 16b. N1 can be for instance 2 or 3 or 4. The second frequency divider has a higher division factor which may be, for instance 250 or 500. The examples above are merely for illustrative purposes and it should be clear that any division factors, where N1<<N (for instance N is at least one or two orders of magnitude larger than N1) may be chosen.

A total division factor of the frequency divider 16 is N*N1 in order to make the PLL's output signal frequency a rational multiple of the reference frequency of a crystal $f_{xtal}$ (the frequency of the signal generated by the input signal generator 11):

$$f_{dco} = N1 \cdot N \cdot f_{xtal}.$$

The output is fed through an optional divider back to the input of the system, producing a negative feedback loop. If the output phase drifts, the error signal will increase, driving the DCO phase in the opposite direction so as to reduce the error. Thus the output phase is locked to the phase at the other input that is called the input signal 20 (also referred to as XTAL, signal1, reference signal). Assume that initially the DCO oscillator 15 is nearly at N*N1 frequency as the reference signal 20. If the phase from the oscillator 15 falls behind that of the reference signal 20, the digital phase detector 12 changes the digital input control of the DCO oscillator 15 so that it speeds up. Likewise, if the phase from the oscillator 15 creeps ahead of the reference signal 20, the phase detector 12 changes the digital input control to slow down the DCO oscillator 15. Since initially the DCO oscillator 15 may be far from the reference signal 20 frequency, practical digital phase detectors 12 may also respond to frequency differences. The digital phase detector 12 compares the phase of DCO signal 24 (after the division factor 1/N and 1/N1) with the phase of the input periodic signal 20 and adjusts the DCO oscillator 15 to keep the phases matched. Bringing the output signal 24 back toward the input signal 20 for comparison is called a feedback loop since the output is "fed back" toward the input forming a loop. Keeping the input and output phase in lock step also implies keeping the input and divided output frequencies the same.

When the ADPLL is in lock condition, the input signal 20 (Xtal, signal1) and the feedback signal 26 are exactly equal and the rising edges of the input signal 20 (XTAL, signal1) and the feedback signal 26 are aligned. If we consider the feedback signal 26 is derived from the first feedback signal 25 by a division factor N, the condition that one period of the input signal 20 (Signal1, T_window) contains exactly N periods of the first frequency divided signal 25 (also referred to as signal2) is always verified. This produces the accurate matching we are looking for in the Vertical Slicing operation.

This approach makes use of PLL locking properties to generate a fractional multiplicity of a given frequency step. A change ΔC in the capacitance of the DCO produces a frequency change Δfstep in the DCO output frequency fout. This change produces a quantization phase step Δϕ=Δfstep*T_xtal where T_xtal is the period where Δfstep is active. SDM techniques spread the Δfstep quantization noise at high frequencies. Divider capacitive techniques create equivalent ΔC' quantization values with known analogue techniques. Then with a DAC it is possible to satisfy the relation ΔC=N_dac*ΔC' and hence Δfstep=N_dac*Δf', where N_dac is the digital input code of the DAC. Δf' is the frequency step of the DCO associated to a capacitance variation of value ΔC' or in other words is the frequency step inside the time window T_xtal and Δfstep is the frequency step associated to a capacitance variation of value ΔC. Due to analog impairments in general the equation ΔC=N_dac*ΔC' will not be exact and this leads to Δfstep≠N_dac*Δf'.

From the relation Δϕ=Δfstep*T_xtal, if T_xtal is segmented in N time slots of duration $\Delta t_{pulse}$ such that N*$\Delta t_{pulse}$=T_xtal, then it is possible to write:

Δϕ=Δfstep*T_xtal=Δfstep*N*$\Delta t_{pulse}$.

This equation shows that it is possible to obtain the quantization phase step Δϕ without using the change of the 'analogue' parameters ΔC and ΔC' that generate the change in Δfstep or Δf'. Instead the quantization phase step is obtained through the equivalent discretization on parameter T_xtal. The minimum quantum $\Delta t_{pulse}$ is present in an ADPLL as the output of DCO or can be derived by the same DCO frequency by means of simple divider structures.

The exact matching N*$\Delta t_{pulse}$=T_xtal is inherent to the lock condition of ADPLL if we consider $\Delta t_{pulse}$ is derived by DCO output frequency and T_xtal is the period of crystal oscillator that is used as reference clock for ADPLL.

From equation Δϕ=Δfstep*N*$\Delta t_{pulse}$ it is possible to determine the equivalent Δf'. Specifically, Δϕ' can be calculated, which is the phase step when only 1 pulse of duration $\Delta t_{pulse}$ is applied (N=1). Accordingly, from the equation Δϕ'=Δfstep*$\Delta t_{pulse}$ it is possible to derive an equivalent average frequency step Δf' inside the time window T_xtal. This can be calculated by dividing Δϕ' by T_xtal. Accordingly Δf' is given by:

Δf'=Δfstep*$\Delta t_{pulse}$/T_xtal=Δfstep/N.

This relation shows that it is possible, given the elementary frequency step Δfstep, to obtain a fractional subdivision of it by means of time quantization instead of analog capacitive quantization.

The accuracy in $\Delta t_{pulse}$ generated in such a way allows for having a very high resolution and precision regarding the targeted value of $\Delta t_{pulse}$.

With this approach the Integral non-linearity (INL) and the Differential non-Linearity (DNL) are moved from analogue ΔC mismatch issues to $\Delta t_{pulse}$ and T_xtal matching.

Moving INL and DNL from analogue capacitance to digital integer number defined by the ratio $\Delta t_{pulse}$/T_xtal increases dramatically the performance. In fact in this case the differential non-linearity is given by:

DNL=σ(ADPLL)/$\Delta t_{pulse}$ where σ(ADPLL) is the noise of ADPLL expressed in jitter. In the advanced CMOS lithography and for RF ADPLL application σ(ADPLL)=250 fs~500 fs and $\Delta t_{pulse}$=250 ps gives a value of:

DNL=(1~2)*10e−3 LSB.

Considering that the best achievable values in the analogue domain are in the range of 0.5 LSB, the improvement in performance is high with regard to conventional approaches. Moreover, a highly linear relationship is achieved. Also a full scale value of the frequency is always equal to Δfstep, so no complex calibration algorithms are needed. The proposed system generates very accurate quanta of $\Delta t_{pulse}$ pulses that are equally spaced into the window T_xtal.

The idea of the present application is to generate by the error signal pulse train modulator 14, based on the fractional digital control word 22f, the digital pulse train 23. The error signal pulse train modulator 14 distributes the pulses of the generated digital pulse train homogeneously over the whole window T_xtal. The pulses are placed in the window T_xtal so as to be as far as possible from each other.

Grouping the pulses together as usual when using simple Pulse Width Code Modulation (PWM) would introduce more noise since the noise of all the grouped pulses would add up. The proposed solution generated a pattern of equally spaced pulses in this window in accordance with fractional digital control word 22f. In this way, the instantaneous phase error generated by the frequency step $\Delta f_{DCO}$ is reduced to its minimum value. In addition, pulses are generated in the digital domain. This allows implementation of the idea in a simpler manner. In an advantageous enhancement, the proposed implementation may use a SD (Delta Sigma) modulation to further shape the quantization noise. A major benefit of this is that the fractional values are obtained in the digital domain by accurate discretization of the time window T_xtal. Therefore, the accuracy that can be achieved with this technique is much higher than the one achievable with techniques based on the resolution of physical or electrical magnitudes or linked to Analog Component Matching, which is difficult to implement.

Figure 4A:
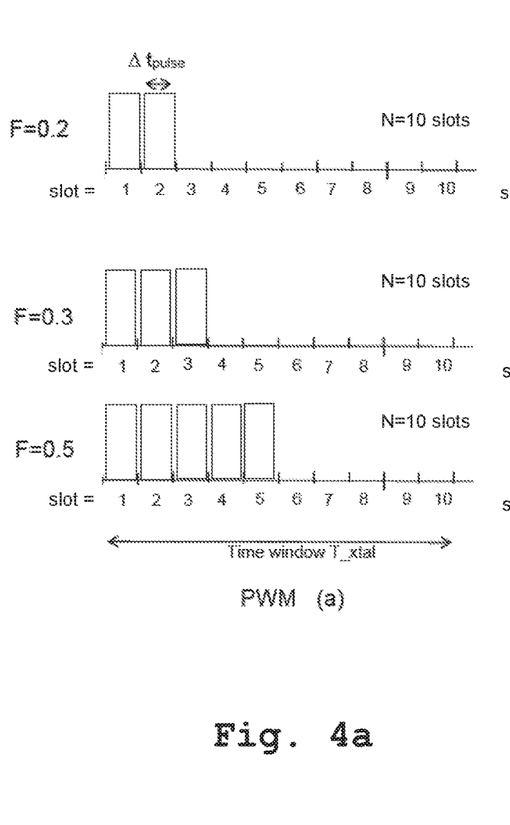
FIG. 4a shows an exemplary modulation in a pulse width modulation scheme.
Figure 4B:
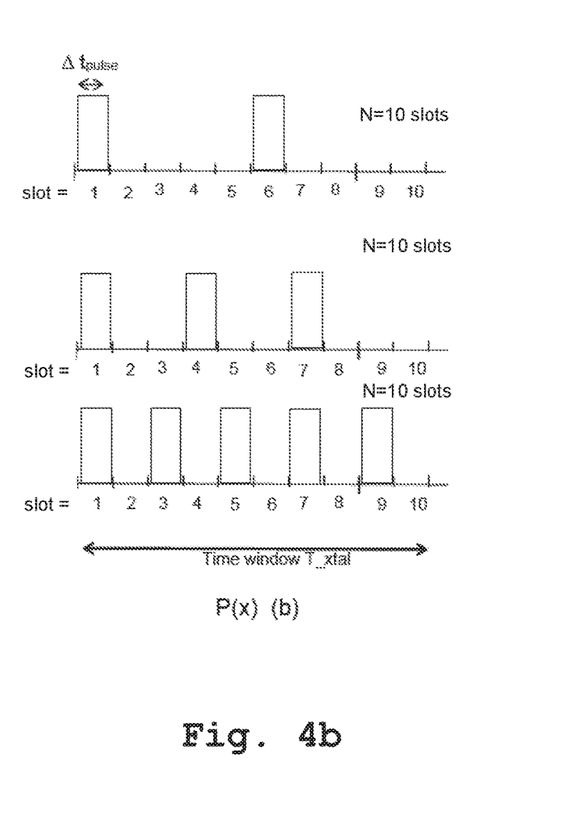
FIG. 4b shows a modulation as used by the oscillator according to the first aspect of the application.

In FIG. 4a, a conventional pulse width modulation is shown in comparison to an exemplary pulse train modulation according to the application, which is shown in FIG. 4b. On the x-axis, a number of slots, which can be filled with either a pulse or a gap, are shown. Diagrams showing different modulation values F are shown above each other.

It is evident that in pulse width modulation pulses corresponding to the input signal are all grouped together. Thus, the entire energy of the modulated signal is concentrated into a single pulse at the beginning of the window. The remainder of the window is empty. On the other hand when using pulse train modulation, the energy is spread over the entire window using a number of pulses. All pulses are of identical width. Also all gaps are of identical widths.

An aspect of the proposed approach is to use the error signal pulse train modulator 14 that uses the output of the DCO or a signal linked to the DCO output by a frequency division circuit (module 16a in FIG. 3) to produce a well-defined pulse of duration $\Delta t_{pulse}$. The window of width T_xtal is divided into N equal slots and each slot can be filled by an impulse of length $\Delta t_{pulse}$, where N is the division factor of the second frequency divider 16b. The number of these pulses is dependent from the value of the frequency step size $\Delta f_{DCO}$ we want to realize. The maximum achievable resolution is:

Res_max=$\Delta f_{DCO}$/N where N=T_xtal/T_DCO

The error signal pulse train modulator 14 fills the slots in the T_xtal window so that the number of filled slots is equal to the fractional digital control word 22f. A well-defined and unique slot position is assigned to each pulse inside the window. In general, for a given fractional digital control word 22f of value x and a number N of different available positions in the window T_xtal, wherein N corresponds to the division factor of the second frequency divider 16b, the number of slot positions available to represent the code can be calculated as:

As an example, if we consider that the time window T_xtal can be completely filled by 10 different impulses of length $\Delta t_{pulse}$ and the fractional digital control word 22f is 4, i.e. 4 different pulses have to be fit inside this window we have:

$$\binom{10}{4} = \frac{10!}{4!(10-4)!}$$

different slot positions available to represent this code. In our case we have N different positions in the Time window T_xtal and we can fill it with a value x $1 \leq x \leq N$ where N is the division factor of the second frequency divider 16b.

The configuration that produces less noise can be determined. A bi-univocal relationship is given between digital input code and slot position inside the T_xtal window. A digital input code gives the representation of the number of $\Delta t_{pulse}$ pulses we want to activate into the system. The slot positions of active $\Delta t_{pulse}$ pulses are determined by mapping the digital code x $1 \leq x \leq N$ to the position of the $\Delta t_{pulse}$ impulses in the T_xtal window that represents the code x so as to maximize the relative distance of $\Delta t_{pulse}$ pulses in the Time window T_xtal. The pulses are spread in the Time window T_xtal in such a way to maximize the relative distance of $\Delta t_{pulse}$ pulses, i.e. the impulses are equally spaced inside the Time window T_xtal. This condition produces less phase quantization noise in the DCO system.

Moreover, by maximizing the relative distance between active $\Delta t_{pulse}$ pulses the quantization phase noise is minimized. There is a fully bi-univocal relationship P(x) between the value of the digital input x and the slot position P of $\Delta t_{pulse}$ pulses inside the T_xtal window:

$X(i) <==> P(x(i)) * \Delta t_{pulse}$, where X(i) is the fractional digital control word 22f, at the sampling step i.

The error signal pulse train modulator 14 produces the function P(x(i)) that completely defines the slot position and the number of $\Delta t_{pulse}$ pulses inside the T_xtal window. As an example, the Loop filter, such as the Digital Loop Filter 13 in FIG. 3 outputs a integer digital control word 22i of value I and a fractional digital control word 22f of value F, where F is the fractional part to be encoded and I is the integer part.

Suppose the following value F=2 and F=3 and F=5 have to be represented. From what was previously explained in the case that the time window T_xtal is divided in N=10 slots, then the different codes are represented respectively by 2 pulses, 3 pulses, and 5 pulses in the Time window T_xtal. The presence of these pulses will represent the fractional code but at the same time will add some quantization noise in the system.

In case PWM is used (see FIG. 4a), the quantization noise on phase is the maximum possible because the pulses are all grouped at the beginning of the time window T_xtal and the frequency step information that is linked to the 0.2, 0.3, and 0.5 code information is added all at once. In the embodiment according to the present application, the pulse duration is split according to the bi-univocal relationship P(x(i)) so that the individual pulses are spread over the time window T_xtal so that the pulses are equally spaced and the distance between the pulses is maximum. In this way the accumulation of quantization noise over the Time window T_xtal can be minimized (FIG. 4b). Although the above embodiment has been described referring to a relationship maximizing the distance between the pulses, which reduces noise, other bi-univocal relationships may be also used. For instance the pulses may be grouped two by two and the distance between the groups may be maximized; or the time window may be divided in two or more sections and the distance of the pulses or group of pulses within the same section may be maximized. According to each different solution the noise will be placed at different frequency ranges. In this manner the application can be applied to different situations and standards.

The modulation scheme produces the well-defined pattern (impulse train) on the active $\Delta t_{pulse}$ pulses inside the Time window T_xtal which has the minimum quantization phase noise. The System can therefore take advantage of SDM techniques to scramble the minimum quantization noise.

Figure 5:
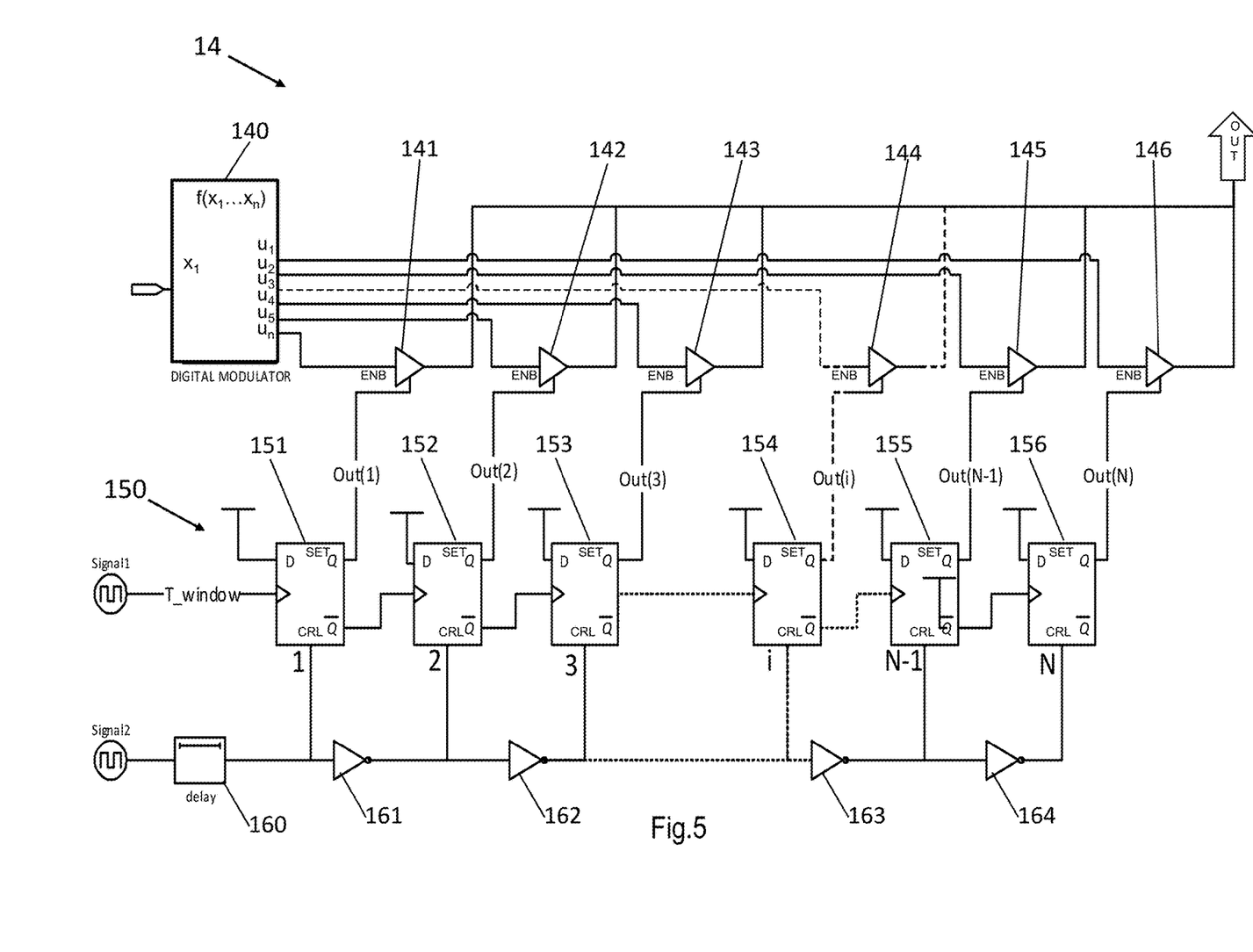
FIG. 5 shows a detail of a second embodiment of an oscillator according to the first aspect of the application.

In FIG. 5, a further embodiment of the oscillator of the first aspect of the application is shown. Especially here, an implementation of the error signal pulse train modulator 14 is depicted. The pulse train modulator 14 comprises an input signal modulator 140 and a flip-flop chain 150 comprising a number of flip-flops 151-156. Each of the flip-flops 151-156 comprises an enable input. The input signal 20 is provided to the first enable input of the first flip-flop 151 of the flip-flop chain 150. Each of the flip-flops comprises an output Q and an inverted output Q. The inverted outputs of the flip-flops 151-155 are connected to an enable input of the respectively following flip-flop 152-156 in the flip-flop chain 150.

The first frequency divided signal 25 is provided to clock signal inputs of the flip-flops 151-156 of the flip-flop chain 150 through a series of delay elements 160-164, resulting in each flip-flop 151-156 receiving the clock signal in a slightly differently delayed version defining the timing of the pulses. The outputs of the flip-flops 151-156 are connected to a weighting unit, which consists of a number of adders 141-146 which sum of the output signals of the flip-flops 151-156 in a weighted manner resulting in the digital pulse train 23.

In general, the idea is implemented as a cascade of N identical flip-flops, wherein N corresponds to the division factor of the second frequency divider 16b. At the input of the system, a pulse $\Delta t\_pulse$ that is synchronized with the rising edge of the input signal 20 (T_clock, Signal1) is present. The rising edge of the input signal 20 starts the process and lets the pulse travel through the flip-flop chain as a travelling wave. The number of flip-flops is: N=T_xtal/$\Delta t_{pulse}$=(first frequency divided feedback signal 25/frequency divided feedback signal 26).

The input signal modulator 140 generates a window map linked directly to the input digital word applied to the system. In this manner, the input of the controllable oscillator 15 sees the travelling pulse only in a particular time position during one period of the low frequency clock signal. The input signal modulator 140 generates a one-to-one mapping between the value of the input digital code and the position of impulse Δt_pulse. The inverted outputs of the flip-flops 151-156 enable the buffer to be transparent for the input signal modulator 140 output $\Delta t_{pulse}$ travelling the flip-flop chain 150 and generating the pulse train at the control of the controllable oscillator.

The position of input quanta can be deterministic, i.e. the position of the window of input code x(i) could always be the same or could be scrambled in the window to take advantage of Sigma-Delta Modulation and shape the quantization noise.

Figure 6:
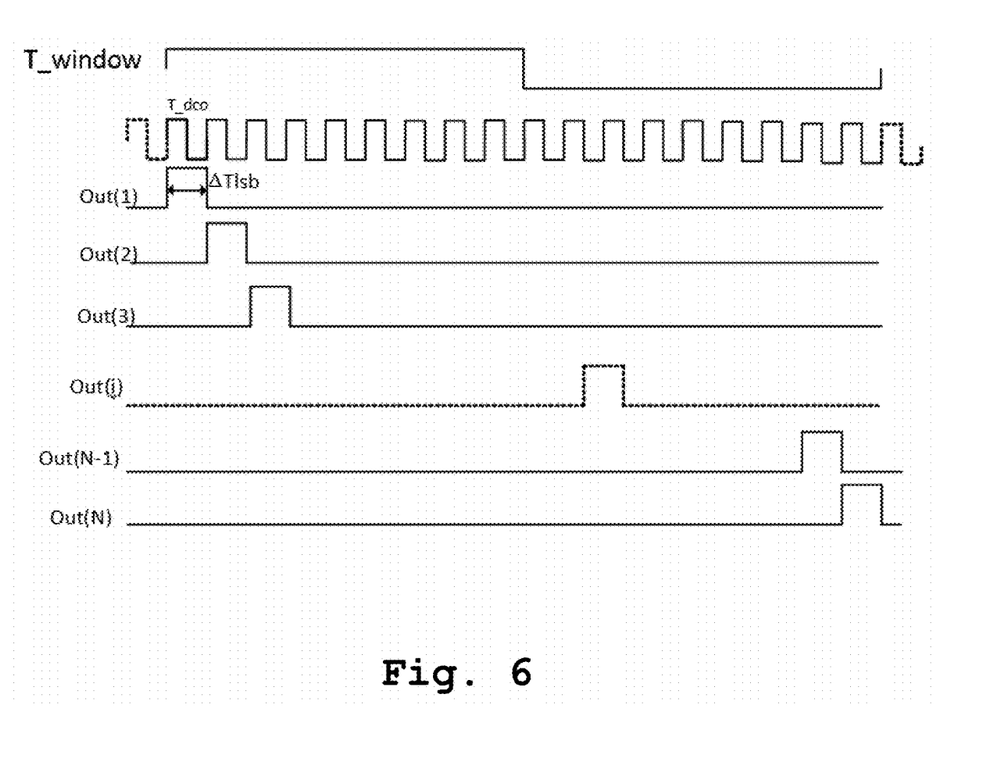
FIG. 6 shows the timing of different signals within an oscillator according to the different embodiments of the first aspect of the application.

In FIG. 6, a number of signals within the oscillator are shown. In a first row, the signal $T_{window}$ is depicted. This signal corresponds to the input signal 20. In a second row, the first frequency divided signal 25 is depicted. The following rows each show a single output signal of one of the flip-flops 151-156 of the flip-flop chain 150. Here, it is clearly visible that the output signals of the flip-flops 151-156 out(1)–out(N) are each slightly time-shifted so that the resulting pulses do not overlap but each fall into one of the slots, as shown in FIG. 4*b*.

Figure 7:
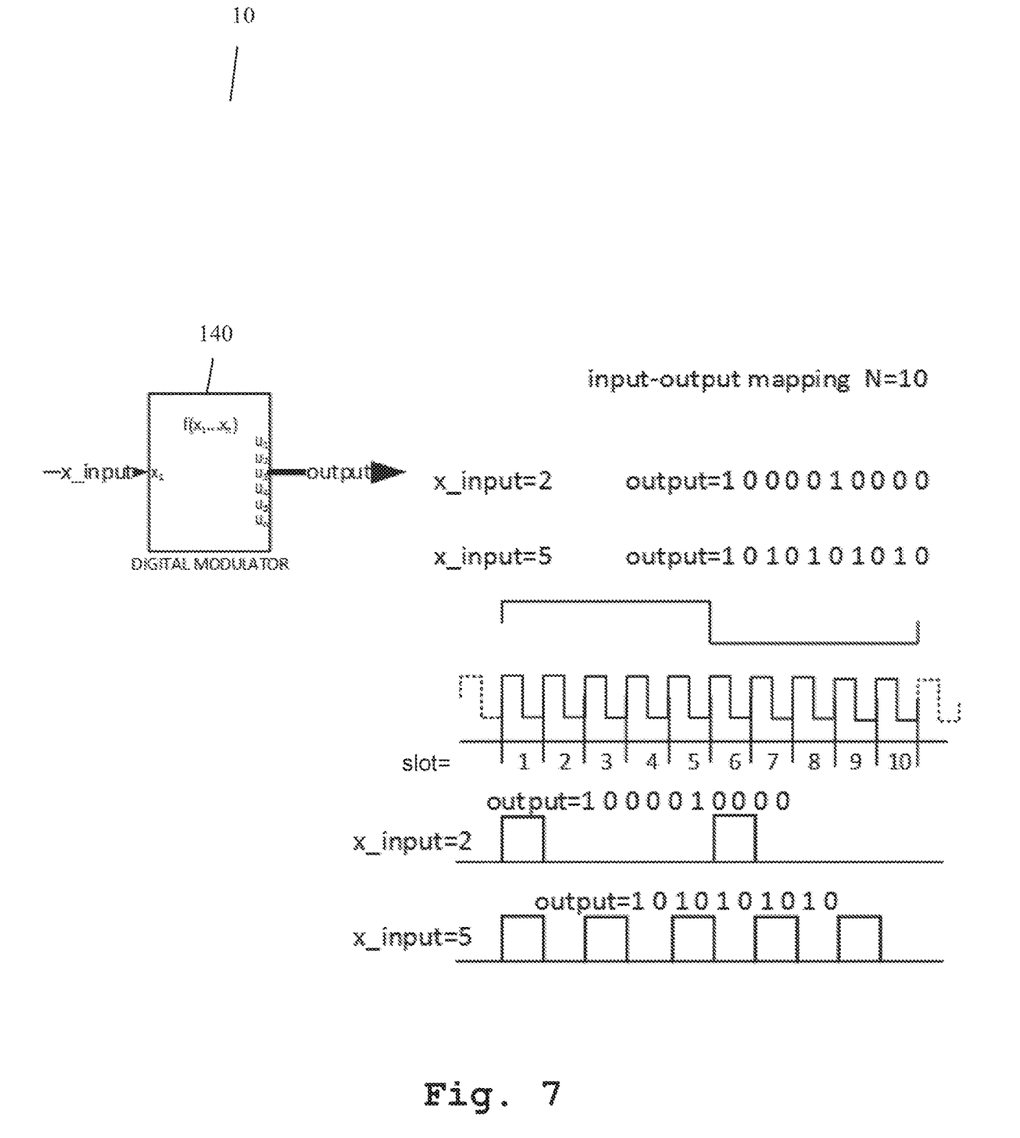
FIG. 7 shows details of the function of a digital modulator as part of a third embodiment of the first aspect of the application.

In FIG. 7, the generation of the wave forms is highlighted for a better understanding of the principle. Consider the case of N=10. Here, two examples of oscillator input signals are shown. A first signal has an input value of 2, while a second signal has an input value of 5. Therefore, for the first signal, the digital code $x_{input}$=2 and for the second signal, the digital code $x_{input}$=5. It can clearly be seen that for the first output signal the slots 1 and 6 are occupied by pulses, while for the second output signal, the slots 1, 3, 5, 7, and 9 are occupied with pulses. The remaining slots are filled with gaps. Therefore, the energy of the signal is well-distributed.

In comparison to a SD Modulation, intrinsically, the quantization noise in pulse train modulation is significantly lower. Moreover, the pulse train modulation produces significantly less instantaneous error than Delta Sigma Modulation because the error is spread over time and not only over frequency. The pulse train modulation is also superior to pulse width modulation.

The position of $\Delta t_{pulse}$ pulses inside the T_xtal window as function of digital code is given: X(i)<==>P(x(i))*$\Delta t_{pulse}$.

Figure 8:
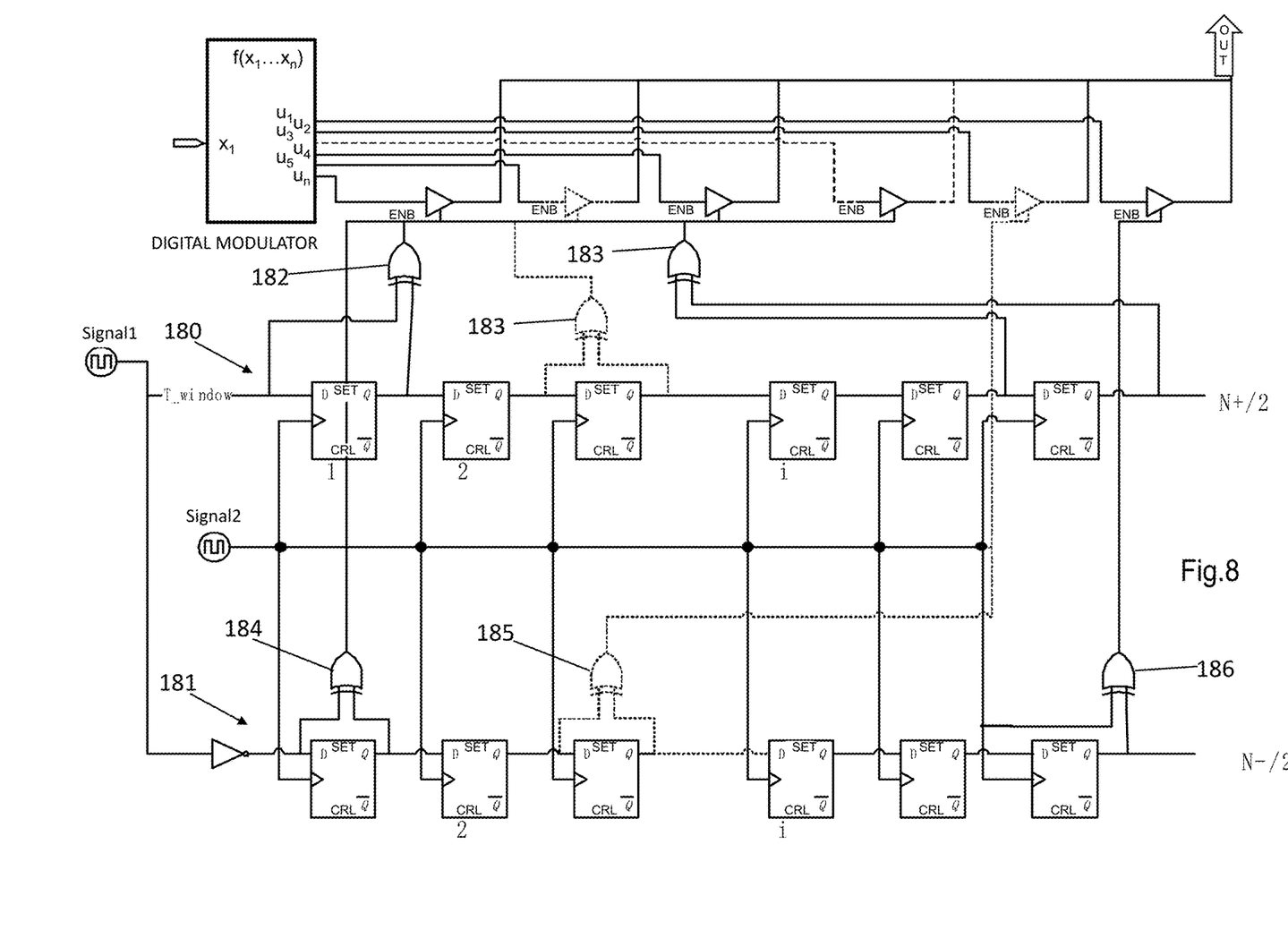
FIG. 8 shows a detail of a fourth embodiment of the first aspect of the application.

In an alternative embodiment, shown in FIG. 8, two flip-flop chains 180, 181 are used. One of the flip-flop chains 180 is synchronized on a positive edge of a differential $\Delta t_{pulse}$ and while the other flop-flop chain is synchronized on the negative edge of the differential $\Delta t_{pulse}$. Here, the first flip-flop chain 180 comprises a number of flip-flops, which are not referenced individually. Also the second flip-flop chain 181 comprises a number of flip-flops, which are not referenced individually. The flip-flop chains 180, 181 are set up in the same manner as the flip-flop chain 150 of FIG. 5.

The difference here is that the first frequency divided signal 25 (signal 2) is connected to the enable ports of all of the flip-flops of the flip-flop chains 180, 181. The input signal 20 (signal 1) is connected to respective input ports of the first flip-flops of the respective flip-flop chains 180, 181. For the second flip-flop chain 181, this signal is delayed by a single pulse. Moreover, inputs and outputs of the respective flip-flops are connected by comparators 182-186, which compare the signals and output the pulse, if the signals are identical. The outputs of these comparators 182-186 are used instead of the outputs of the flip-flops of FIG. 5 and are entered into the weighting unit for weighting and adding up the resulting signal. The system could take any number of parallel chains synchronized on different signals.

Figure 9:
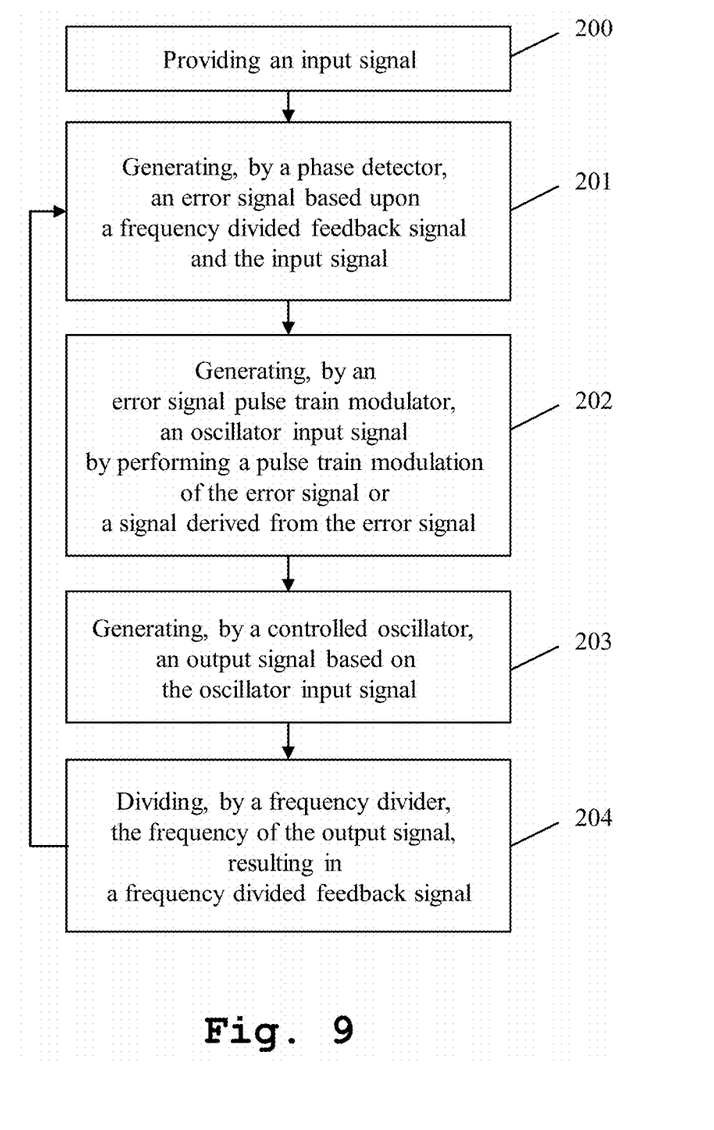
FIG. 9 shows an embodiment of the second aspect of the application.

In FIG. 9, an embodiment of the second aspect of the application is shown. In block 200 an input signal is provided. This input signal corresponds to the signal 20 of FIG. 3. In block 201, a phase detector generates an error signal based upon a frequency divided feedback signal and the input signal. The error signal corresponds to the error signal 21 of FIG. 3. In block 202 an error signal pulse train modulator generates an oscillator input signal by performing a pulse train modulation on the error signal or a signal derived from the error signal. The oscillator input signal includes the digital pulse train 23 and integer digital control word 22*i* of FIG. 3. The frequency divided feedback signal corresponds to the frequency divided feedback signal 26 of FIG. 3. The error signal may correspond to the error signal 21 of FIG. 3. The signal derived from the error signal corresponds to the digital control word 22 of FIG. 3. In block 203 a controlled oscillator generates an output signal based on the oscillator input signal. In block 204, a frequency divider divides the frequency of the output signal resulting in a frequency divided feedback signal, which is fed back to the block 201 and used by the phase detector for generating the error signal.

The proposed approach achieves a very low frequency control step in the oscillator and hence realizes a DCO with very low quantization noise using digital modulation techniques. No calibration algorithm is needed, since the exact calibration is inherent to the locking condition of ADPLL.

The structure is far simpler than conventional solutions, because it does not need N parallel equal structures to perform fine and coarse frequency steps inside the DCO as in capacitive divider structures. The frequency stepping is realized in the time domain with the pulse train modulation. It reduces the complexity and design effort of DCO core that is the most sensitive block in ADPLL. The complexity moved from analog to digital section.

The application is not limited to the examples shown in the figures. The characteristics of the exemplary embodiments can be used in any advantageous combination.

The application has been described in conjunction with various embodiments herein. However, other variations to the disclosed embodiments can be understood and effected by those skilled in the art in practicing the claimed application, from a study of the drawings, the disclosure and the appended claims. In the claims, the word "comprising" does not exclude other elements or steps and the indefinite article "a" or "an" does not exclude a plurality. A single processor or other unit may fulfill the functions of several items recited in the claims. The mere fact that certain measures are recited in usually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the internet or other wired or wireless communication systems.

What is claimed is:

1. An oscillator, comprising:
   a controlled oscillator configured to generate an output signal based on an oscillator input signal;
   a frequency divider configured to divide a frequency of the output signal to generate a frequency divided feedback signal;
   a phase detector configured to generate an error signal based upon the frequency divided feedback signal and an input signal;

a loop filter configured to low-pass filter the error signal to generate a filtered error signal; and an error signal pulse train modulator configured to generate the oscillator input signal by being configured to perform a pulse train modulation of the filtered error signal or a signal derived from the filtered error signal based on the input signal, wherein the oscillator input signal comprises a number x of pulses separated by a number (N−x) of gaps within a period of the input signal, wherein N is a number of time slots for pulses and gaps within the period of the input signal, wherein the number x of pulses is proportional to the error signal or the signal derived from the error signal, and wherein the output signal is phase locked to the input signal.

2. The oscillator of claim 1, wherein the error signal pulse train modulator is further configured to:

equally space the x number of pulses over the period of the input signal, and equally space the (N−x) gaps over the period of the input signal.

3. The oscillator of claim 1, wherein the error signal pulse train modulator is further configured to:

set an equal first time duration for all pulses, and set an equal second time duration for all gaps.

4. The oscillator of claim 1, wherein the error signal pulse train modulator comprises an input signal modulator configured to generate a number N of modulator output signals, wherein a number x of the N modulator output signals is at a high state, wherein a number (N−x) of the modulator output signals is at a low state, wherein x/N is proportional to the error signal or the signal derived from the error signal, and wherein the error signal pulse train modulator is further configured to generate the oscillator input signal from x/N.

5. The oscillator of claim 4, wherein the error signal pulse train modulator further comprises a flip-flop chain, wherein the flip-flop chain comprises N flip-flops, wherein the input signal is supplied to an enable input of a first flip-flop in the flip-flop chain, and wherein the N flip-flops of the flip-flop chain are arranged so that an inverted output of each flip-flop is connected to an enable input of a following flip-flop in the flip-flop chain.

6. The oscillator of claim 4, wherein the error signal pulse train modulator further comprises a first flip-flop chain and a second flip-flop chain, wherein the first flip-flop chain comprises N/2 flip-flops, wherein the second flip-flop chain comprises N/2 flip-flops, wherein the input signal is supplied to an enable input of a first flip-flop in the first flip-flop chain and to a first flip-flop in the second flip-flop chain, wherein the N/2 flip-flops of the first flip-flop chain are arranged so that an inverted output of each flip-flop is connected to an enable input of a following flip-flop in the first flip-flop chain, wherein the N/2 flip-flops of the second flip-flop chain are arranged so that an inverted output of each flip-flop is connected to an enable input of a following flip-flop in the second flip-flop chain, wherein the first flip-flop chain is active during a high period of the input signal, and wherein the second flip-flop chain is active during a low period of the input signal.

7. The oscillator of claim 5, wherein the error signal pulse train modulator further comprises a weighting unit configured to weigh the output of each flip-flop with one of the N modulator output signals to generate N weighted flip-flop output signals.

8. The oscillator of claim 7, wherein the weighting unit is further configured to add the N weighted flip-flop output signals to generate the oscillator input signal.

9. The oscillator of claim 5, wherein clock inputs of the N flip-flops are supplied with a clock signal derived from the output signal.

10. The oscillator of claim 9, wherein the frequency divider comprises:

a first frequency divider configured to divide the frequency of the output signal to generate a first frequency divided signal; and a second frequency divider configured to divide a frequency of the first frequency divided signal to generate the frequency divided feedback signal, and wherein the first frequency divided signal is the clock signal.

11. The oscillator of claim 1, wherein the input signal, the output signal, the oscillator input signal, the frequency divided feedback signal, the error signal, and the signal derived from the error signal are digital signals, and wherein the controllable oscillator is a digitally controllable oscillator.

12. The oscillator of claim 1, wherein a frequency of the input signal is at least by a factor of 10 lower than the frequency of the output signal.

13. A method for generating an output signal, comprising:

generating, by a controlled oscillator, the output signal based on an oscillator input signal;

dividing, by a frequency divider, a frequency of the output signal to generate a frequency divided feedback signal;

generating, by a phase detector, an error signal based upon the frequency divided feedback signal and an input signal;

low-pass filtering, by a loop filter, the error signal to generate a filtered error signal; and generating, by an error signal pulse train modulator, the oscillator input signal by performing a pulse train modulation of the filtered error signal or a signal derived from the filtered error signal based on the input signal, wherein the oscillator input signal comprises a number x of pulses separated by a number (N−x) of gaps within a period of the input signal, wherein N is a number of time slots for pulses and gaps within the period of the input signal, wherein the number x of pulses is proportional to the error signal or the signal derived from the error signal, and wherein the output signal is phase locked to the input signal.

14. The method of claim 13, further comprising:

spacing equally, by the error signal pulse train modulator, the x number of pulses over the period of the input signal; and spacing equally, by the error signal pulse train modulator, the (N−x) gaps over the period of the input signal.

15. The method of claim 13, further comprising:
setting, by the error signal pulse train modulator, an equal first time duration for all pulses, and
setting, by the error signal pulse train modulator, an equal second time duration for all gaps.

16. The method of claim 13, further comprising:
generating, by the error signal pulse train modulator, a number N of modulator output signals, wherein a number x of the N modulator output signals is at a high state, a number (N−x) of the modulator output signals is at a low state, wherein x/N is proportional to the error signal or the signal derived from the error signal, and
generating, by the error signal pulse train modulator, the oscillator input signal from x/N.

* * * * *